(12) United States Patent
Weng et al.

(10) Patent No.: US 9,929,154 B2
(45) Date of Patent: Mar. 27, 2018

(54) FIN SHAPE STRUCTURE

(71) Applicant: UNITED MICROELECTRONICS CORP., Hsin-Chu (TW)

(72) Inventors: Wen-Yin Weng, Taichung (TW); Cheng-Tung Huang, Kaohsiung (TW); Wei-Heng Hsu, Kaohsiung (TW); Yu-Ming Lin, Tainan (TW); Ya-Ru Yang, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 107 days.

(21) Appl. No.: 14/541,085

(22) Filed: Nov. 13, 2014

(65) Prior Publication Data

US 2016/0141288 A1 May 19, 2016

(51) Int. Cl.
*H01L 27/085* (2006.01)
*H01L 27/088* (2006.01)
*H01L 29/66* (2006.01)
*H01L 29/78* (2006.01)
*H01L 29/205* (2006.01)
*H01L 29/165* (2006.01)
*H01L 21/762* (2006.01)

(Continued)

(52) U.S. Cl.
CPC ........ *H01L 27/0886* (2013.01); *H01L 21/762* (2013.01); *H01L 21/8258* (2013.01); *H01L 21/823412* (2013.01); *H01L 21/823431* (2013.01); *H01L 21/823807* (2013.01); *H01L 21/823821* (2013.01); *H01L 27/0924* (2013.01); *H01L 29/0653* (2013.01); *H01L 29/165* (2013.01); *H01L 29/205* (2013.01); *H01L 29/66795* (2013.01); *H01L 29/7849* (2013.01); *H01L 29/7851* (2013.01); *H01L 21/02532* (2013.01); *H01L 21/02535* (2013.01); *H01L 21/02543* (2013.01); *H01L 21/02546* (2013.01); *H01L 21/02639* (2013.01)

(58) Field of Classification Search
CPC ............ H01L 27/0886; H01L 27/0924; H01L 29/66795; H01L 29/7849
See application file for complete search history.

(56) References Cited

U.S. PATENT DOCUMENTS

| 5,995,529 A * | 11/1999 | Kurtz | ................ B82Y 20/00 257/94 |
| 2007/0138565 A1* | 6/2007 | Datta | .............. H01L 21/823807 257/369 |

(Continued)

FOREIGN PATENT DOCUMENTS

CN 101976667 7/2012

*Primary Examiner* — Kimberly Rizkallah
*Assistant Examiner* — Maria Ligai
(74) *Attorney, Agent, or Firm* — Winston Hsu

(57) ABSTRACT

A fin shaped structure and a method of forming the same. The method includes providing a substrate having a first fin structure and a second fin structure. Next, an insulation material layer is formed on the substrate. Then, a portion of the first fin structure is removed, to form a first recess. Following this, a first buffer layer and a first channel layer are formed sequentially in the first recess. Next, a portion of the second fin structure is removed, to form a second recess. Then, a second buffer layer and a second channel layer are formed in the second recess sequentially, wherein the second buffer layer is different from the first buffer layer.

12 Claims, 5 Drawing Sheets

(51) Int. Cl.

| | |
|---|---|
| *H01L 21/8234* | (2006.01) |
| *H01L 21/8238* | (2006.01) |
| *H01L 27/092* | (2006.01) |
| *H01L 29/06* | (2006.01) |
| *H01L 21/8258* | (2006.01) |
| *H01L 21/02* | (2006.01) |

(56) References Cited

U.S. PATENT DOCUMENTS

| | | | |
|---|---|---|---|
| 2013/0001591 A1* | 1/2013 | Wu | H01L 21/823821 257/77 |
| 2013/0099283 A1 | 4/2013 | Lin et al. | |
| 2013/0196488 A1 | 8/2013 | Hekmatshoartabari et al. | |
| 2014/0175379 A1 | 6/2014 | Chu-Kung et al. | |
| 2014/0209976 A1* | 7/2014 | Yang | H01L 29/1054 257/190 |
| 2014/0329374 A1* | 11/2014 | Rodder | H01L 29/66469 438/478 |
| 2014/0353715 A1* | 12/2014 | Xiao | H01L 27/0886 257/190 |
| 2014/0377922 A1* | 12/2014 | Fung | H01L 29/66795 438/283 |

* cited by examiner

FIN SHAPE STRUCTURE

BACKGROUND OF THE INVENTION

1. Field of the Invention

The present invention relates to a fin shaped structure and a method of forming the same, and more particularly to a fin shaped structure having a buffer layer with a band gap thereof being greater than that of a channel layer, and a method of forming the same.

2. Description of the Prior Art

The increasing miniaturization of the field effect transistors (FETs) has led to high performance and high operation speed of semiconductor devices. Accordingly, multiple gate MOSFET structures, such as fin field effect transistors (FinFETs), have been introduced to 14 nm node for sustaining high carrier mobility and electric properties. However, under the demand for continuously shrinking the size of the device, the characteristics of currently used silicon material presents many challenges and limitations. Thus, it is crucial to introduce some high efficient materials, for further improving the device quality of those downscaling FinFETs.

SUMMARY OF THE INVENTION

It is one of the primary objectives of the present invention to provide a fin shaped structure, which has a buffer layer with a greater band gap than a channel layer, so that the fin shaped structure may obtain sufficiently greater band offset, thereby supplying preferable channel mobility and improving the short channel effect.

It is another one of the primary objectives of the present invention to provide a method of forming a fin shaped structure, in which a fin shaped structure having a group III-V epitaxial structure and a group IV epitaxial structure is obtained, so as to achieve silicon on insulator (SOI) like performance to improve the short channel effect.

To achieve the purpose described above, the present invention provides a fin shaped structure including a first fin structure, and a second fin structure. The first fin structure is disposed on a substrate and includes a first buffer layer and a first channel layer covering the first buffer layer, wherein the first buffer layer has a greater band gap relative to the first channel layer. The second fin structure is disposed on the substrate and includes a second buffer layer and a second channel layer covering the second buffer layer, wherein the second buffer layer has a greater band gap relative to the second channel layer. Wherein, the first buffer layer is different from the second buffer layer.

To achieve the purpose described above, the present invention provides a method of forming a fin shaped structure, including following steps. First of all, a substrate having a first fin structure and a second fin structure is provided. Next, an insulation material layer is formed on the substrate. Then, a portion of the first fin structure is removed, to forma first recess in the insulation material layer. Following this, a first buffer layer is formed in the first recess, and a first channel layer is then formed in the first recess on the first buffer layer. Next, a portion of the second fin structure is removed, to form a second recess in the insulation material layer. Then, a second buffer layer is formed in the second recess, wherein the second buffer layer is different from the first buffer layer. Finally, a second channel layer is formed in the second recess on the second buffer layer.

In the method of the present invention, a greater band offset is sufficiently provided through selectively forming the epitaxial buffer layers and the epitaxial channel layers in the fin structures respectively, such that the fin shaped structure obtained thereto can obtain SOI-like performance, and further achieve the purpose of supplying preferable channel mobility and improving the short channel effect.

These and other objectives of the present invention will no doubt become obvious to those of ordinary skill in the art after reading the following detailed description of the preferred embodiment that is illustrated in the various figures and drawings.

DETAILED DESCRIPTION

In the following description, numerous specific details, as well as accompanying drawings, are given to provide a thorough understanding of the invention. It will, however, be apparent to one skilled in the art that the invention may be practiced without these specific details.

Figure 1:
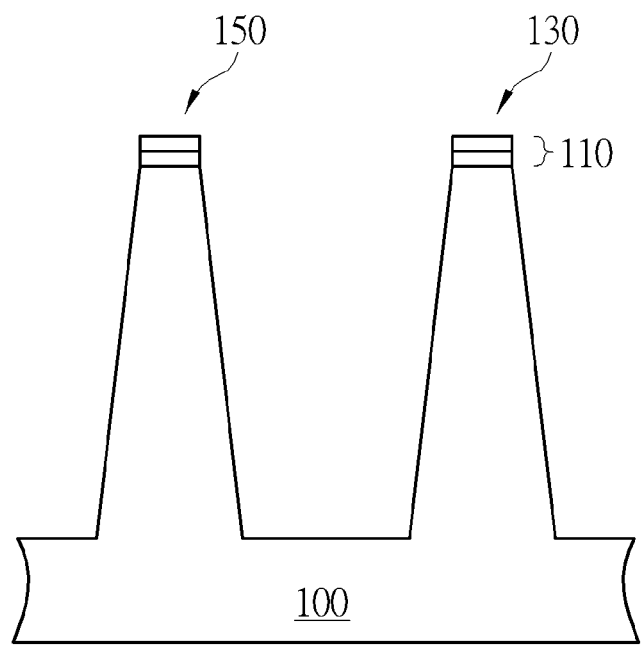
FIG. 1 to FIG. 8 are schematic diagrams illustrating a method of forming a fin shaped structure according to a preferred embodiment of the present invention.

Referring to FIGS. 1-8, FIGS. 1-8 are schematic diagrams illustrating a method of forming a fin shaped structure according to a preferred embodiment of the present invention. As shown in FIG. 1, a substrate 100 is firstly provided, wherein a first fin structure 130 and a second fin structure 150 are formed on the substrate 100 respectively. The substrate 100 may include a semiconductor material, such as silicon, silicon germanium, silicon carbide, or silicon on insulator (SOI), but not limited thereto. In another embodiment, the substrate 100 may also include non-semiconductor material, such as glass. Precisely speaking, the first fin structure 130 and the second fin structure 150 may be formed by directly transferring the pattern of a patterned hard mask layer 110 to the substrate 100, or through a sidewall image transferring (SIT) process, for example forming a plurality of mandrels (not shown in the drawings) firstly on the substrate, forming a plurality of spacers (not shown in the drawings) surrounding each of the mandrels respectively, and removing the mandrels and using the closed rectangular frames of the spacers as a mask to form the patterned hard mask layer 110, so as to obtain a finer pitch. However, those skilled in the art would easily realize that the fin structures of the present invention are not limited to be formed according thereto, and may also be formed through other suitable processes.

Figure 2:
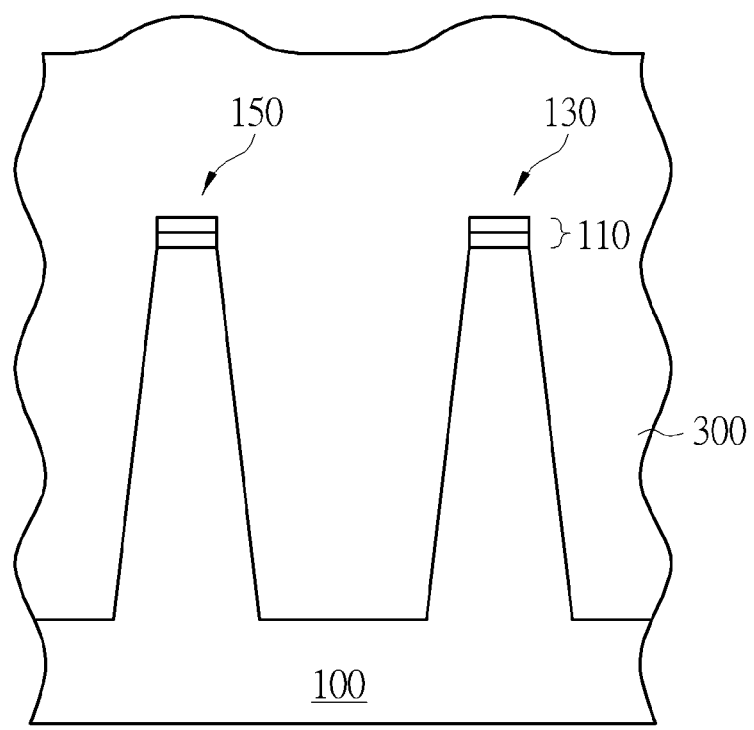
Figure 3:
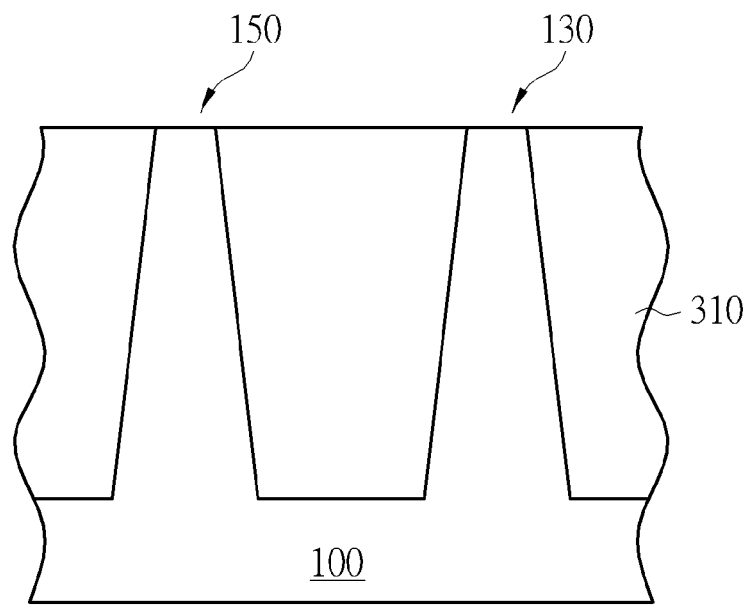

Next, as shown in FIGS. 2-3, an insulation material layer 300 is formed on the substrate 100 to directly cover the first fin structures 130 and the second fin structure 150, and then, a suitable planarization process, such as a chemical mechanical planarization or polishing (CMP) process may be performed, to progressively remove a portion of the insulation material layer 300 and the hard mask layer 110, to form an insulation material layer 310 shown in FIG. 3. It is worth mentioning that, the insulation material layer 310 surrounds the first fin structure 130 and the second fin structure 150, and is leveled up with top surfaces of the first fin structure 130 and the second fin structure 150.

Figure 4:
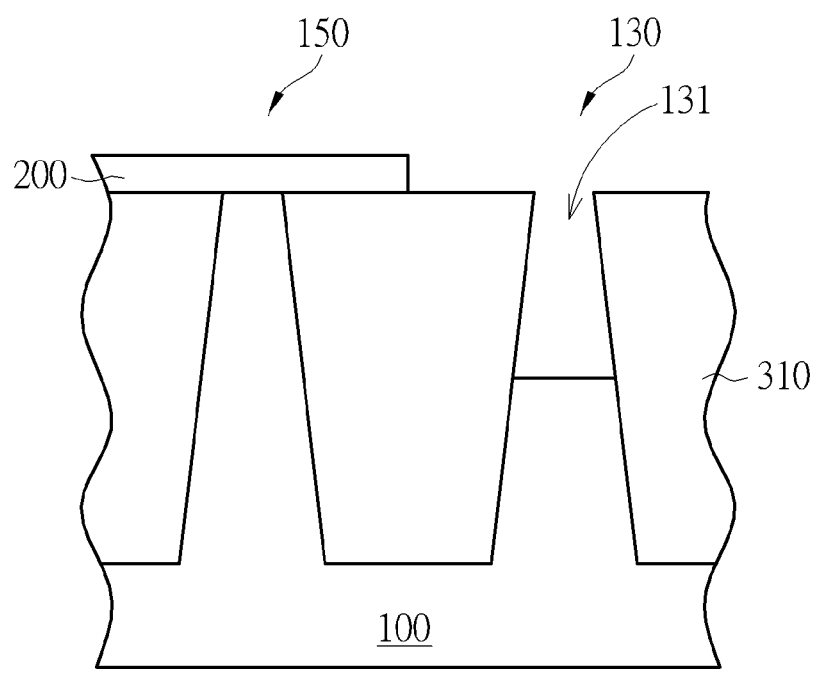

Then, as shown in FIG. 4, a portion of the first fin structure 130 is removed to form a first recess 131 in the insulation material layer 310. Precisely, the first recess 131 may be formed by forming a patterned mask layer 200 on the insulation material layer 310, to cover the second fin structure 150 only, and carrying out a suitable removing process, such as a dry etching process or a wet etching process, to remove the portion of the first fin structure 130. In one embodiment, the patterned mask layer 200 may include a photoresist layer or a mask material, preferably a material having an etching selectivity relative to the substrate 100 and the insulation material layer 310, such as nitride, but not limited thereto.

Figure 5:
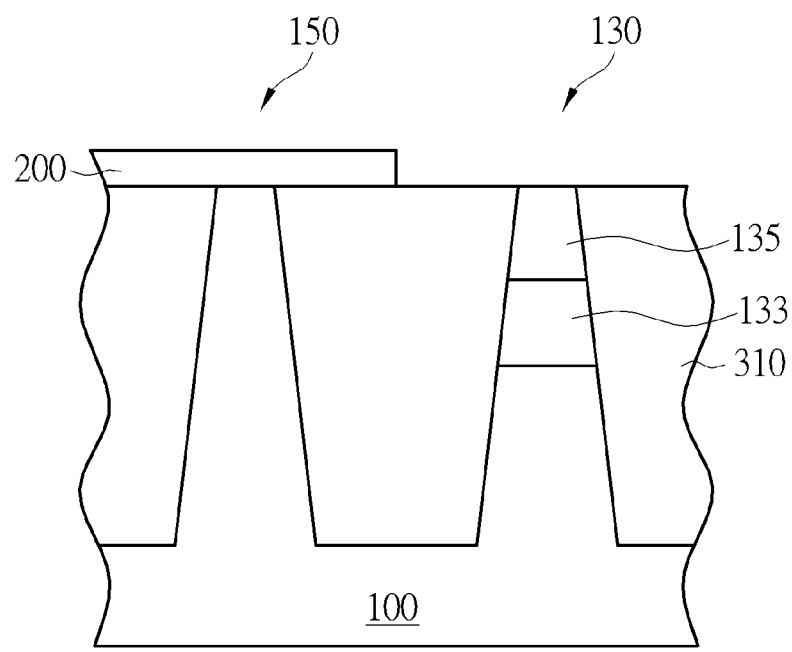

Following this, in view of FIG. 5, a first buffer layer 133 and a first channel layer 135 are formed in the first recess 131 respectively, from bottom to top. In the present embodiment, the first buffer layer 133 and the first channel layer 135 may be formed through a selective epitaxial process, but not limited thereto. In another embodiment, first buffer layer and the first channel layer may also be formed through other suitable processes. Precisely, the first buffer layer 133 may have a P-type or N-type epitaxy, and has a greater band gap relative to that of the first channel layer 135, so as to provide a SOI-like performance. For example, the first buffer layer 133 and the first channel layer 135 may include the same material indifferent concentrations, or different materials, but not limited thereto. In a preferred embodiment, the first buffer layer 133 may include a group III-V semiconductor material or a group IV semiconductor material, wherein the group III-V semiconductor material may be a binary or a ternary compound, such as InP or InAsP, and the group IV semiconductor material may be an unary compound or a binary compound, such as Ge, GeSn or SiGe; and the first channel layer 135 may include the group III-V semiconductor material or the group IV semiconductor material, wherein the group III-V semiconductor material may be a binary or a ternary compound, such as InAs or $In_{0.53}GaAs$, and the group IV semiconductor material may be an unary compound or a binary compound, such as Ge, GeSn, or SiGe. Please note that, the first buffer layer 133 may include SiGe, with a concentration of Ge therein being 0.1-0.5, while the first channel layer 135 also includes SiGe; and the first buffer layer 133 may include GeSn, with a concentration of Sn therein being relatively greater, while the first channel layer 135 also includes GeSn. However, those skilled in the art would easily realize that it is not limited to having the aforementioned materials in such composition.

Figure 6:
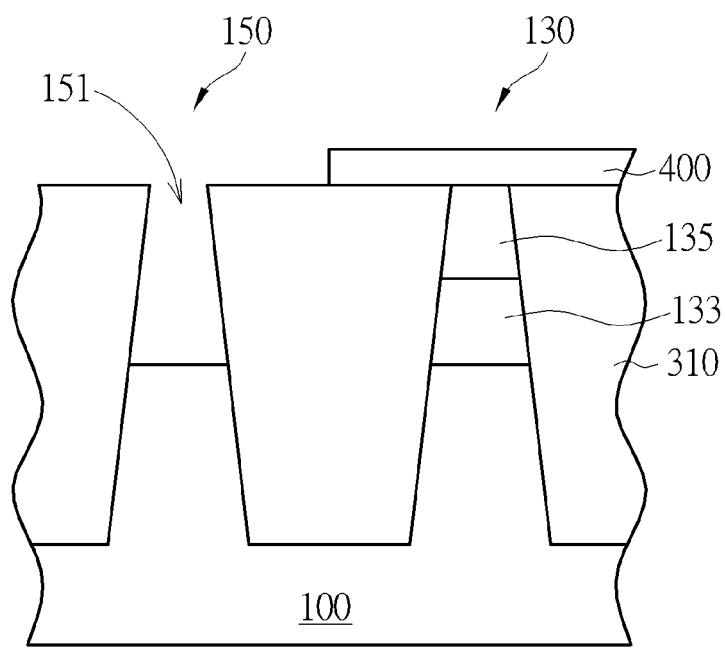
Figure 7:
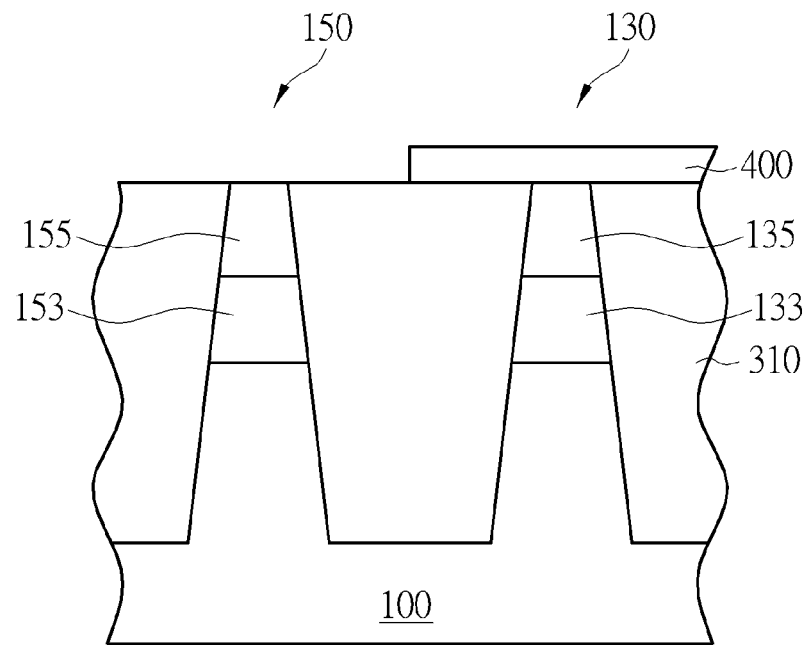

Turning next, as shown in FIGS. 6-7, after the patterned mask layer 200 is removed, a portion of the second fin structure 150 is removed to form a second recess 151 in the insulation material layer 310, and then a second buffer layer 153 and a second channel layer 155 are formed in the second recess 151 respectively, from bottom to top. Precisely speaking, another patterned mask layer 400 is formed on the insulation material layer 310, to cover the first fin structure 130, and a suitable removing process, such as a dry etching process or a wet etching process is performed on the exposed second fin structure 150, for removing the portion of the second fin structure 150. The patterned mask layer 400 may include a photoresist layer, or a mask material, such as material having an etching selectivity relative to the substrate 100 and the insulation material layer 310, such as nitride, but not limited thereto. Then, the second buffer layer 153 and the second channel layer 155 are sequentially formed in the second recess 151, for example, through a selective epitaxial process, but the present invention is not limited thereto. Please note that, the second buffer layer 153 is preferably different from the first buffer layer 133, for example, the second buffer layer 153 and the first buffer layer 133 may have different conductive types or include different materials, but the present invention is not limited thereto. In another embodiment, the second buffer layer 153 may have the same conductive type as the first buffer layer 133, namely, the second buffer layer 153 may have an N-type or a P-type epitaxy while the first buffer layer 133 also has an N-type epitaxy or a P-type epitaxy.

Furthermore, similar to the first buffer layer 133, the second buffer layer 153 has a greater band gap relative to that of the second channel layer 155, for example, the second buffer layer 153 and the second channel layer 155 may include the same material in different concentrations, or different materials. In a preferred embodiment, the second buffer layer 153 may include a group III-V semiconductor material or a group IV semiconductor material, wherein the group III-V semiconductor material may be a binary or a ternary compound, such as InP or InAsP, and the group IV material may be an unary compound or a binary compound, such as Ge, GeSn or SiGe; and the second channel layer 155 may include the group III-V semiconductor material or the group IV semiconductor material, wherein the group III-V semiconductor material may be a binary or a ternary compound, such as InAs or $In_{0.53}GaAs$, and the group IV semiconductor material may be an unary compound or a binary compound, such as Ge, GeSn, or SiGe. Please note that, the second buffer layer 153 may include SiGe, with a concentration of Ge therein being 0.1-0.5, while the second channel layer 155 also includes SiGe; and the second buffer layer 153 may include GeSn, with a concentration of Sn therein being relatively greater, while the second channel layer 155 also includes GeSn. However, those skilled in the art would easily realize that it is not limited to having the aforementioned materials in such composition.

Figure 8:
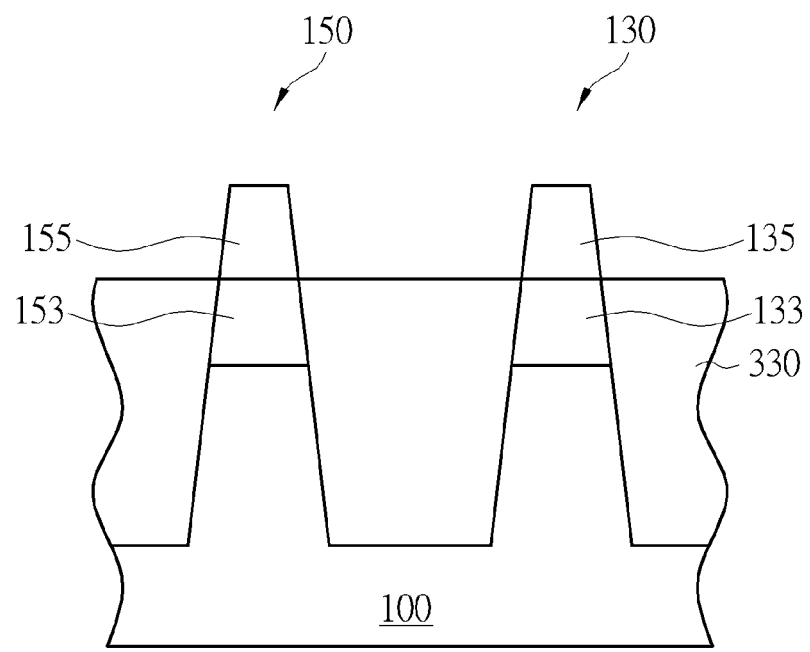

After that, as shown in FIG. 8, after the patterned mask layer 400 is removed, an etching back process is performed to form an insulation layer 330. Precisely, the etching back process is carried out through a dry etching process or a wet etching process, to at least remove a portion of the insulation material layer 310 surrounding the first channel layer 135 and the second channel layer 155, thereby at least exposing a portion of the first channel layer 135 and a portion of the second channel layer 155. In other words, a top surface of the insulation layer 330 is not lower than top surfaces of the first buffer layer 133 and the second buffer layer 153, so as to configure as a shallow trench isolation (STI). In the present embodiment, the insulation layer 330 is leveled up with the top surfaces of the first buffer layer 133 and the second buffer layer 153, such that, the first channel layer 135 and the second channel layer 155 are completely exposed therefrom.

Thus, through the aforementioned processes, the fin shaped structure of the present invention is obtained. It is noted that, through selectively forming the epitaxial buffer layers and the epitaxial channel layers in the fin structures respectively, a greater band offset can be sufficiently obtained, such that the fin shaped structure of the present invention can obtain SOI-like performance, and further achieve the purpose of supplying preferable channel mobility and improving the short channel effect.

Figure 9:
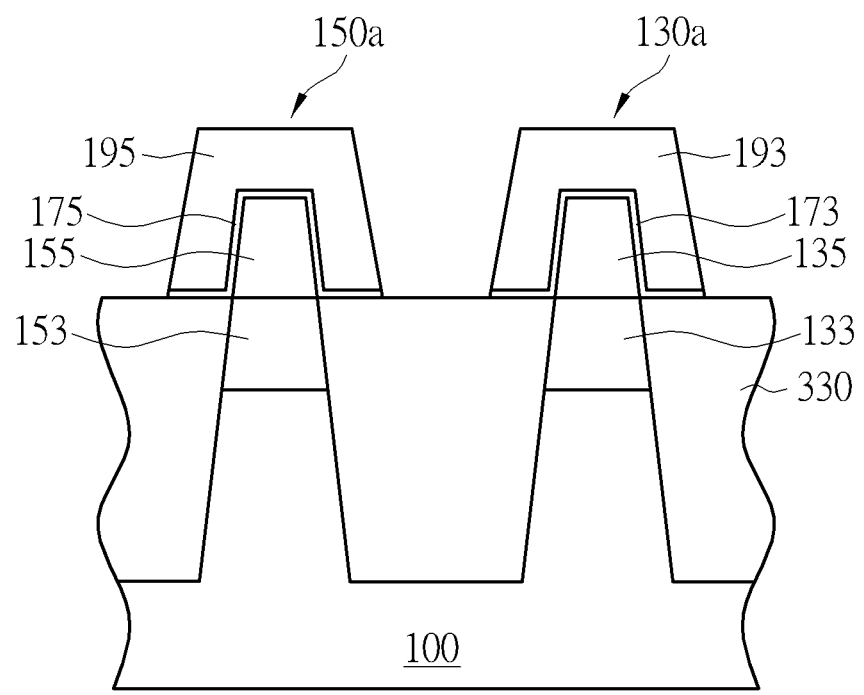
FIG. 9 is schematic diagrams illustrating a semiconductor device based on a fin shaped structure according to a preferred embodiment of the present invention.

In addition, the method of the present invention can be integrated into a general semiconductor process, to form a FinFET device based on the fin structure of the aforementioned preferred embodiment. For example, gate dielectric layers 173, 175 and gate electrodes 193, 195 as shown in FIG. 9 are formed respectively on the first fin structure 130 and the second fin structure 150 respectively to form a first FinFET 130a and a second FinFET 150a, with the gate electrodes 193, 195 crossing over the first fin structure 130 and the second fin structure 150 to serve as a tri-gate structure. As following, source/drain regions (not shown in the drawings) may be formed in a portion of the channel layers 135, 155 where is uncovered by the gate electrodes 193, 195, for example through forming recesses in the portion of the channel layers 135, 155 and selectively forming epitaxial source/drain structures in the recesses respectively, such that a portion of the channel layers 135, 155 will be remained between the source/drain regions and the buffer layers 133, 153 for maintaining the SOI-like performance. However, in another embodiment, the source/drain regions (not shown in the drawings) may also be formed in a portion of the channel layers 135, 155 and the buffer layers 133, 153 where is uncovered by the gate electrodes 193, 195, such that the epitaxial source/drain structures formed thereafter may preferably include a material having relative less band gap to the buffer layers 133, 153, for sustaining the SOI-like performance. However, those in the arts will easy to realize the present invention is not limited thereto.

The first FinFET 130a includes the fin structure 130 disposed on the substrate 100, and the fin structure 130 includes the first buffer layer 133 and the first channel layer 135 covering the first buffer layer 133, wherein the first buffer layer 133 has a greater band gap relative to the first channel layer 135. Likewise, the second FinFET 150a includes the second fin structure 150 also disposed on the substrate 100, and the second fin structure 150 includes the second buffer layer 153 and the second channel layer 155 covering on the second buffer layer 153, wherein the second buffer layer 153 has a greater band gap relative to the second channel layer 155. Also, it is worth mentioning that, the first buffer layer is different from the second buffer layer, for example, different in conductive types, or different in composed materials. Additionally, there is an insulation layer 330 disposed on the substrate 100, and partially covering the first fin structure 130 and the second fin structure 150, wherein at least a portion of the first channel layer 135 and at least a portion of the second channel layer 155 are protruded and exposed from the insulation layer 330.

In an preferred embodiment, the first buffer layer 133 and the second buffer layer 153 include a group III-V semiconductor material, for example a binary or a ternary compound, such as InP or InAsP, or a group IV semiconductor material, for example, a binary compound, such as SiGe or GeSn; and the first channel layer 135 and the second channel layer 155 include a group III-V semiconductor material, for example a binary or a ternary compound, such as InAs or InGaAs, or a group IV semiconductor material, for example, an unary or binary compound, such as Ge, SiGe or GeSn. Also, in one embodiment, the first buffer layer 133 includes SiGe, with a concentration of Ge therein being 0.1-0.5, while the first channel layer 135 also includes SiGe, or the first buffer layer 133 includes GeSn, with a concentration of Sn therein being relatively greater, while the first channel layer 135 also includes GeSn. Moreover, in a most preferred embodiment, the first FinFET 130a and the second FinFET 150a have different conductive types, for example, the first FinFET 130a is an NMOS while the first buffer layer 133 incudes InP and the first channel layer 135 incudes $In_{0.53}GaAs$, and the second FinFET 150a is a PMOS while the second buffer layer 153 incudes SiGe and the second channel layer 155 incudes Ge, but not limited thereto. In another embodiment of the present invention the first FinFET 130a and the second FinFET 150a may also have the same conductive type, for example, with both of the first FinFET 130a and the second FinFET 150a being an NMOS or a PMOS but having different composed materials in buffer layers 133, 153 and the channel layers 135, 155, so as to provide various electrical properties.

Also, it will be appreciated that the aforementioned embodiment depicts forming the epitaxial buffer layer and the channel layer in a "non-planar FETs structure." However, the present invention can also be applicable to form an epitaxial buffer layer and the channel layer in a "planar FETs structure." For example, a first recess may be formed in a planar semiconductor substrate. Thereafter, an epitaxial buffer layer and the epitaxial channel layer are formed sequentially in the recess to serve SOI-like performance in a planar MOSFET.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fin shaped structure, comprising:
a first fin structure disposed on a substrate, comprising:
a first buffer layer directly contacting the substrate, wherein the first buffer layer comprises group III-V semiconductor material; and
a first channel layer directly covering the first buffer layer, wherein the first buffer layer has a greater band gap relative to the first channel layer; and
a second fin structure disposed on the substrate, comprising:
a second buffer layer, directly contacting the substrate, wherein the second buffer layer comprises group IV semiconductor material, and the first buffer layer and the second buffer layer are surrounded by an insulation layer covering the substrate; and
a second channel layer directly covering the second buffer layer, wherein the second buffer layer has a greater band gap relative to the second channel layer;
wherein the first buffer layer is different from the second buffer layer, and at least a portion of the first channel layer and at least a portion of the second channel layer are protruded and exposed from the insulation layer, and the first fin structure and the second fin structure are tapered from bottom to top.

2. The fin shaped structure according to claim 1, wherein the first buffer layer and the second buffer layer have a same conductive type.

3. The fin shaped structure according to claim 2, wherein the first buffer layer and the second buffer layer comprise a group III-V semiconductor material or a group IV semiconductor material.

4. The fin shaped structure according to claim 1, wherein the first buffer layer and the second buffer layer have different conductive types.

5. The fin shaped structure according to claim 1, wherein the group III-V semiconductor material is a binary compound or a ternary compound.

6. The fin shaped structure according to claim 5, wherein the binary compound comprises InP.

7. The fin shaped structure, according to claim 5, wherein the ternary compound comprises InAsP.

8. The fin shaped structure according to claim 1, wherein the group IV semiconductor material is a binary compound.

9. The fin shaped structure, according to claim 8, wherein the binary compound comprises SiGe or GeSn.

10. The fin shaped structure, according to claim 1, wherein the first channel layer and the second channel layer comprises a group IV semiconductor material, or a group III-V semiconductor material.

11. The fin shaped structure, according to claim 10, wherein the group IV semiconductor material comprises SiGe, Ge, or GeSn.

12. The fin shaped structure, according to claim 10, wherein the III-V semiconductor material comprises InAs, or $In_{0.53}GaAs$.

* * * * *